United States Patent [19]
Miyashita et al.

[11] Patent Number: 5,250,595
[45] Date of Patent: Oct. 5, 1993

[54] FLAME-RETARDANT RESIN COMPOSITION

[75] Inventors: Shunitsu Miyashita; Kenji Mogami, both of Kobe, Japan

[73] Assignee: Kanegafuchi Kagaku Kogyo Kabushiki Kaisha, Osaka, Japan

[21] Appl. No.: 859,242

[22] Filed: Mar. 26, 1992

Related U.S. Application Data

[63] Continuation of Ser. No. 658,456, Feb. 22, 1991, abandoned, which is a continuation of Ser. No. 483,309, Feb. 21, 1990, abandoned, which is a continuation of Ser. No. 379,662, Jul. 13, 1989, abandoned, which is a continuation of Ser. No. 945,709, Dec. 23, 1986, abandoned.

[30] Foreign Application Priority Data

Dec. 25, 1985 [JP] Japan ..................... 60-297809

[51] Int. Cl.$^5$ ............................. C08K 5/54
[52] U.S. Cl. ................... 524/114; 524/188; 524/265; 524/410
[58] Field of Search ............ 524/188, 410, 114, 265

[56] References Cited

U.S. PATENT DOCUMENTS

| | | | |
|---|---|---|---|
| 3,435,093 | 3/1969 | Cope | 524/176 |
| 3,488,318 | 1/1970 | Stewart | 524/265 |
| 3,652,484 | 3/1972 | Weissermel et al. | 524/265 |
| 3,892,667 | 7/1975 | Touval | 252/609 |
| 4,035,333 | 7/1977 | Kamada et al. | 524/410 |
| 4,100,075 | 7/1978 | Ashman et al. | 252/609 |
| 4,338,243 | 7/1982 | Hecht et al. | 524/410 |

OTHER PUBLICATIONS

Scholder et al: CA 52 19638f (1958).
Schrewelius: CA 32 7324g (1938).

*Primary Examiner*—Veronica P. Hoke
*Attorney, Agent, or Firm*—Armstrong, Westerman, Hattori, McLeland & Naughton

[57] ABSTRACT

A flame-retardant resin composition includes a thermoplastic polyester, a flame retardant containing an organic halide compound in an amount required for providing flame-retardancy, an antimony compound, and an alkoxidesilane compound in an amount required for providing thermostability. The flame-retardant resin composition has a high strength and excellent thermal stability.

9 Claims, No Drawings

FLAME-RETARDANT RESIN COMPOSITION

This application is a continuation of application Ser. No. 07/658,456, filed Feb. 22, 1991 which in turn is a continuation of application Ser. No. 483,309 filed Feb. 21, 1990 which in turn is a continuation of application Ser. No. 379,662 filed Jul. 13, 1989 which in turn is a continuation of application Ser. No. 945,709 filed Dec. 23, 1986, all now abandoned.

BACKGROUND OF THE INVENTION

1. Field of the Invention

This invention relates to a flame-retardant resin composition and, more specifically, it relates to a flame-retardant resin composition, comprising a thermoplastic polyester which displays a excellent mechanical property and thermal stability.

Flame-retardant resin compositions comprising thermoplastic polyesters using organic halide compounds as the main ingredient have suffered from a problem in their thermal stability. Particularly, flame-retardant resin compositions composed of polyethylene terephthalate are excellent in their heat-resistance but have a relatively high molding temperature and exhibit remarkable heat degradation upon molding. A flame retardant resin composition comprising thermoplastic polyester having an improved thermal stability is disclosed, for example, in Japanese Patent Application (OPI) No. 195142/82 (the term "OPI" herein used means "unexamined published application"). In this composition, the surface of antimony trioxide added for providing flame-retarding property is treated with an alkoxysilane to form membrane inactive to the hydrolysis of the thermoplastic polyester thereby improving the thermostability. However, as can be seen from the examples of Japanese Patent Application (OPI) No. 195142/82, the mechanical strength, particularly the tensile strength of the molding product is relatively low and not yet sufficiently satisfactory for specific uses. Japanese Patent Application No. 2357/82 describes that covered antimony oxide has no thermal stability of commercial value. Japanese Patent Application (OPI) No. 2357/82 describes a specific composition which is excellent in the thermal stability. According to the specification thereof, when a particular substance for improving the crystallizing rate and an antimonate salt of a metal belonging to group I, II and VIII of the Periodic Table, are used together in a flame-retardant, they do not have adverse effects on the thermal stability and improve the flame-retardancy. Generally, since crystallization stimulators tend to reduce the mechanical strength of the resin composition, their use is limited. Further, the possible range of applying this technique is limited since the effect can only be obtained in the combined use of a specific crystallization stimulator and an antimonate salt. Accordingly, a flame-retardant resin composition composed of a thermoplastic polyester having a relatively high mechanical strength and, at the same time, excellent thermal stability has been demanded.

SUMMARY OF THE INVENTION

An object of the present invention is to provide a flame-retardant resin composition comprising a thermoplastic polyester having a relatively high mechanical strength and excellent thermal stability in view of the foregoing situations.

The object of the present invention can be attained in accordance with the present invention by a flame-retardant resin composition comprising the following ingredients (a), (b) and (c):

(a) a thermoplastic polyester, (b) a flame-retardant containing an organic halide compound in an amount required for providing flame-retardancy, and (c) an alkoxy silane compound in an amount required for providing thermal stability.

The thermoplastic polyester of the present invention is a saturated linear polyester prepared by reacting a terephthalic acid or a derivative capable of forming esters thereof as an acid ingredient, with a glycol having 2 to 10 carbon atoms or a derivative capable of forming esters thereof as a glycol ingredient. Specifically, there can be mentioned a polyethylene terephthalate, a polypropylene terephthalate, a polybutyrene terephthalate, a polytetramethylene terephthalate and a polyhexamethylene terephthalate. These thermoplastic polyesters may be used alone or in admixture of two or more of them. Further, the thermoplastic polyester may contain up to 50% by weight of other ingredients, for example, a diethylene glycol, a polyalkylene oxide, an aromatic diol, etc. Among them, those block copolymers comprising from 1 to 20 parts by weight of a diol represented by the following formula (A) and from 80 to 99 parts by weight of polyethylene terephthalate are particularly preferred:

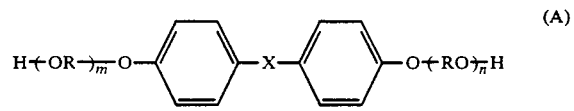

(A)

wherein X represents a divalent connecting group such as —C(CH$_3$)$_2$— group, —SO$_2$— group, —CO— group or —O— group; R represents an alkylene group having 1 to 4 carbon atoms; and n and m each represents an integer from 1 to 15. The intrinsic viscosity of the thermoplastic polyester when measured at 25° C. in a mixed solvent of phenol and 1,1,2,2-tetrachloroethane (1 : 1 weight ratio) is preferably from 0.4 to 1.2, more preferably, from 0.5 to 1.0 and most preferably, from 0.55 to 0.70.

The flame-retardants referred to in the present invention are those comprising organic halide compound as a main ingredient and also contain, as required, an antimony compound. The organic halide compound may include, specifically, tetrabromobisphenol A and oligomers thereof, decabromobiphenyloxide, octabromobiphenyloxide, poly(dibromophenyleneoxide), polystyrene bromide, condensate of 2 mol of tetrachlorocyclopentadiene and 1 mol of cyclooctadiene, poly(pentabromobenzyl acrylate), condensate of tetrabisphenol A, cyanuric chloride and tribromophenol, hexabromocyclododecane and condensate of tribromophenol and glycidol and the like. Among them, aromatic halide compounds in which halogen atoms are directly coupled to the aromatic ring are preferably used. As the halogen, bromine or chlorine is preferred. The organic halide compound may be used in a sufficient amount for providing the composition with flame-retardancy, usually, in an amount of from 5 to 50 parts by weight and, preferably, from 10 to 30 parts by weight based on 100 parts by weight of the thermoplastic polyester. The antimony compound optionally used includes, for example, antimony trioxide, antimony pentoxide, sodium antimonate, etc. Sodium antimonate is excellent for imparting the thermal stability of the flame-retardant resin composition comprising thermoplastic polyester. Particularly, sodium antimonate baked at a temperature of not lower than 600° C. is preferred. Above all, sodium antimonate having an average particle size of from 2 to 10 μm baked at a temperature of not lower than 600° C. is most preferable. The amount of the antimony compound used is from 0 to 20 parts by weight, preferably, from 1 to 15 parts by weight and, particularly, from 2 to 10 parts by weight based on 100 parts by weight of the thermoplastic polyester.

The alkoxy silane compound is a compound represented by the following formula (B):

wherein each of $R_1$, $R_2$, $R_3$ and $R_4$ is an alkyl group having 1 to 5 carbon atoms or $-C_mH_{2m}-O-C_n-H_{2n+1}$ wherein m+n is an integer of 5 or less, and X represents $-CH=CH_2$, $-COOCH_3C=CH_2$, $-NH_2$, $-NHC_2H_4NH_2$, $-NHCONH_2$,

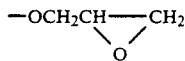

and the like. The compounds in which X contains an amino group or an epoxy group are referred to as an amino silane compound or an epoxy silane compound, respectively. The amount of the alkoxy silane compound to be mixed is preferably from 0.03 to 2.0% by weight, more preferably, from 0.05 to 10% by weight and, most preferably, from 0.1 to 0.5% by weight of the flame-retardant resin.

Various methods may be employed for mixing the alkoxy silane compound and other ingredients in the flame-retardant resin composition. For the most simple and general method, the alkoxy silane compound may be added while mixing a thermoplastic polyester and a flame-retardant in a ribbon blender. The alkoxy silane compound has been used as the surface treating agent for glass fibers or the like. A thermally stable composition according to the present invention cannot be obtained by merely mixing the glass fibers surface-treated with the alkoxy silane compound, etc., with a flame-retardant resin composition.

In the flame-retardant resin composition according to the present invention, 1 to 10 parts by weight of a copolymer of ethylene and α,β-unsaturated carboxylic acid in which 5 to 50 mol % of carboxylic groups contained in the copolymer are neutralized with an alkali metal may be blended based on 100 parts by weight of the thermoplastic polyester. The copolymers are disclosed in Japanese Patent Publication No. 26225/70, Japanese Patent Application (OPI) Nos. 3839/71, 55451/81, for example, copolymers of ethylene and α,β-unsaturated carboxylic acid such as acrylic acid, methacrylic acid, maleic acid or like, wherein the olefin content is at least 50% by weight and 5 to 50 mol % of the carboxylic groups in the copolymer are neutralized with an alkali metal salt. A preferred alkali metal is sodium.

The flame-retardant resin composition according to the present invention may further be blended with up to 200 parts by weight of organic or inorganic reinforcing substance or filler, if required, based on 100 parts by weight of the thermoplastic polyester. If the blending amount exceeds 200 parts by weight, molding of the composition becomes difficult and the mechanical strength of the composition is reduced as well. A preferred blending amount is less than 150 parts by weight. The organic or inorganic reinforcing substance or filler mean those materials that are added for improving the properties of the molded flame-retardant resin composition in, for example, enhancing strength and elasticity, protecting bend, minimizing dimensional change, etc. Specifically, they include fibrous reinforcing material such as glass fibers, carbon fibers, asbestos, aromatic polyamide fibers, silicon carbide fibers, potassium titanate fibers and mineral fibers, as well as calcium carbonate, magnesium carbonate, calcined clay, graphite, mica, talc, glass beads, metal powder, fluoro resin powder and the like. They are used alone or in admixture of two or more of them.

In the flame-retardant resin composition according to the present invention, those additives usually employed for thermoplastic flame-retardant polyester resins, for example, anti-oxidant, coloring agent, crystallization stimulator, plasticizer, resins other than polyester and the like, may be blended in addition to the above-mentioned ingredients.

The composition after mixing the thermoplastic polyester, flame-retardant, alkoxy silane compound and the like can further be formed into a uniform and easily usable flame-retardant composition when further subjected to mixing under melting. The mixing under melting is conveniently carried out by using an extruder.

The flame-retardant resin composition of the present invention is particularly advantageous when used with various components, such as electronic parts, electric parts, parts for office automation devices, automobile parts, and the like.

The present invention will now be described more specifically with referring to Examples and Comparative Examples, but it should be noted that the present invention is no way limited only thereto. In the Examples and Comparative Examples, "parts" and "%" are by weight.

EXAMPLE 1

While stirring 4.6 kg of polyethylene terephthalate having an intrinsic viscosity of 0.63 measured at 25° C. in a mixed solvent of phenol and 1,1,2,2-tetrachloroethane (1 : 1 weight ratio) and dried to a water content of less than 0.03%, 1.4 kg of polystyrene bromide "PYROCHECK 68PB" (trade name of products manufactured by Ferro Corporation), 0.3 kg of sodium antimonate calcined at 700° C, 0.5 kg of a copolymer of ethylene and unsaturated carboxylic acid "HI-MIRAN 1707" (trade name of products manufactured by Mitsui-Du Pont Polychemical Co.), 0.2 kg of erucic acid amide, 50 g of a stabilizer "IRGANOX 1010" (trade name of products manufactured by Ciba Gigy Limited), 50 g of a stabilizer "SEANOX 412S" (trade name of products manufactured by Shipro Kasei Kaisha Co.) in a ribbon blender, 15 g of γ-aminopropyltriethoxy silane (A-1100 manufactured by Nippon Unicar Co.) were added and the stirring was continued for 5 minutes.

The blend was kneaded under melting by using a biaxial extruder "PCM-45" manufactured by Ikegai Tekko Co., to obtain a pellet-like resin composition. Glass fibers (Glasslon 03MJ-486A manufactured by Asahi Fiber Glass Co.) were added by 30% of the composition at the midway of the biaxial extruder.

As the temperature condition for the extrusion, a temperature gradient of from 200° to 260° C. was created from the hopper side toward the dice side.

Other conditions were selected as usual for enabling stable extrusion operation. Then, the pelletized resin was dried at 140° C. for 4 hours and then test specimens were prepared by using an injection molding machine (IS-50A manufactured by Toshiba Kikai Co.).

As an evaluation method for the thermal stability, mechanical strength was examined at temperature levels, i.e., at a normal temperature (270° C.) and at a higher temperature (290° C.). The injection molding conditions were mold temperature of 80° C., cooling time of 30 sec, primary injecting pressure of 495 kg/cm², secondary injection pressure of 360 kg/cm² and injection time of 7 seconds. The thermal stability was evaluated by comparing the tensile strength of the products molded at 270° C. and 290° C. The results are shown in Table 1.

The molded products satisfied requirements of U.L. (Underwriters Laboratories) Standard 94 as V-O using a specimen of 1/32 inch in thickness.

EXAMPLE 2

The procedure of Example 1 was repeated except that 20 g of Y-glycideoxypropyltrimethoxy silane (A-187, manufactured by Nippon Unicar Co.) were used instead of Yaminopropyl triethoxy silane. The results are shown in Table 1.

The molded products satisfied requirements of U.L. (Underwriters Laboratories) Standard 94 as V-O using a specimen of 1/32 inch in thickness.

COMPARATIVE EXAMPLE 1

In the same manner as in Example 1, a composition without adding Y-aminopropyltriethoxy silane was prepared and evaluated. Other conditions were the same as those in Example 1. The results are shown in Table 1.

The molded products also satisfied requirements of U.L. Standard 94 as V-O.

COMPARATIVE EXAMPLE 2

The procedure of Example 1 was repeated except using glass fibers prepared according to the following procedure. The results are shown in Table 1.

Preparation of Glass Fibers 5.0 kg of "GLASSLON 03MJ-486A" were charged in a ribbon blender, and a mixture of 25 g of distilled water, 225 g of methanol and 25 g of "A-1100" mixed thoroughly were added under stirring and the stirring was continued for 5 minutes. The resulting mixture was dried at 130° C. for 2 hours.

TABLE 1

|  | Example 1 | Example 2 | Comparative Example 1 | Comparative Example 2 |
|---|---|---|---|---|
| (1) Tensile strength molded at 270° C. (kg/cm²) | 1540 | 1550 | 1350 | 1460 |
| (2) Tensile strength molded at 290° C. (kg/cm²) | 1510 | 1540 | 1350 | 1370 |
| (2) × 100/(1) (%) | 98.1 | 99.4 | 100 | 93.8 |

Note: The tensile strength was measured according to ASTM D-638.

As is apparent from the results shown in Table 1, the flame-retardant resin composition according to this invention possessed high strength and excellent thermal stability.

The molded products also satisfied requirements of U.L. Standard 94 as V-O.

EXAMPLE 3

The procedure of Example 2 was repeated except using 0.3 kg of antimony trioxide (PATOX-H manufactured by Nippon Seiko Co.) instead of sodium antimony. The results are shown in Table 2.

The molded products satisfied requirements of U.L. (Underwriters Laboratories) Standard 94 as V-O using a specimen of 1/32 inch in thickness.

EXAMPLE 4

The procedure of Example 1 was repeated except using 1.3 kg of poly-pentabromobenzyl acrylate (FR-1025 manufactured by Ded C. Bromine Co.) instead of "PYROCHECK 68PB". The results are shown in Table 2 below.

The molded products satisfied requirements of U.L. (Underwriters Laboratories) Standard 94 as V-O using a specimen of 1/32 inch in thickness.

COMPARATIVE EXAMPLE 3

The procedure of Comparative Example 2 was repeated except using "PATOX-H" instead of sodium antimonate and "FR-1025" instead of "PYROCHECK 68PB", respectively. The results are shown in Table 1 below.

TABLE 2

|  | Example 3 | Example 4 | Comparative Example 3 |
|---|---|---|---|
| (1) Tensile strength molded at 270° C. (kg/cm²) | 1530 | 1560 | 1460 |
| (2) Tensile strength molded at 290° C. (kg/cm²) | 1500 | 1520 | 1210 |
| (2) × 100/(1) (%) | 98.0 | 97.4 | 82.9 |

The molded products also satisfied requirements of U.L. Standard 94 as V-O.

EXAMPLE 5

The procedure of Example 2 was repeated except using polyethylene terephthalate having intrinsic viscosity of 0.60, in which ethylene oxide addition polymer of bisphenol A (bisphenol A to ethylene oxide is 17, average molecular weight 1000) was block copolymerized by 5% was used instead of polyethylene terephthalate having an intrinsic viscosity of 0.63 as stated in Example 1. Other conditions were same as in Example 2.

| | |
|---|---|
| (1) Tensile strength molded at 270° C. (kg/cm²) | 1540 |
| (2) Tensile strength molded at 290° C. (kg/cm²) | 1530 |
| (2) × 100/(1) (%) | 99.4 |

The molded products satisfied requirements of U.L. (Underwriters Laboratories) Standard 94 as V-O using a specimen of 1/32 inch in thickness.

EXAMPLE 6

A mixture of 5.3 kg of polyethylene terephthalate having an intrinsic viscosity of 0.58 when measured at 25° C. in a mixed solvent of phenol and 1,1,2,2-tetrachloroethane (1:1 weight ratio) and being dried to water content of less than 0.03%, 1.4 kg of polydibromophenylene oxide (PO-64P manufactured by Great Lakes Chemical Corporation), 0.3 kg of sodium antimonate, 50 g of "IRGANOX 1010", 50 g of "SEANOX 412S", 10 g of "A-187" and "GLASSLON 03MJ-486A" in an amount of 30% of the composition were processed in the same manner as in Example 1 to obtain a test piece. The results are shown in Table 3 below.

The molded products satisfied requirements of U.L. (Underwriters Laboratories) Standard 94 as V-O using a specimen of 1/32 inch in thickness.

EXAMPLE 7

The procedure of Example 6 was repeated except that the polyethylene block copolymer used in Example 5 was used instead of polyethylene terephthalate of Example 6. The results are shown in Table 3 below.

The molded products satisfied requirements of U.L. (Underwriters Laboratories) Standard 94 as V-O using a specimen of 1/32 inch in thickness.

EXAMPLE 8

The resin composition without adding the glass fibers was prepared in the same manner as in Example 2. The results are shown in Table 3 below.

The molded products satisfied requirements of U.L. (Underwriters Laboratories) Standard 94 as V-O using a specimen of 1/32 inch in thickness.

COMPARATIVE EXAMPLE 4

A resin composition without adding "A-187" was prepared in the same manner as in Example 8. The results are shown in Table 3 below.

TABLE 3

| | Example 6 | Example 7 | Example 8 | Comparative Example 4 |
|---|---|---|---|---|
| (1) Tensile strength molded at 270° C. (kg/cm²) | 1560 | 1570 | 678 | 675 |
| (2) Tensile strength molded at 290° C. (kg/cm²) | 1560 | 1560 | 680 | 573 |
| (2) × 100/(1) (%) | 100 | 99.4 | 100.3 | 84.9 |

As has been described above according to the present invention, a flame retardant resin composition having high strength and excellent thermal stability can be provided.

The molded products also satisfied requirements of U.L. Standard 94 as V-O.

While the invention has been described in detail and with reference to specific embodiments thereof, it will be apparent to one skilled in the art that various changes and modifications can be made therein without departing from the spirit and scope thereof.

What is claimed is:

1. A flame-retardant resin composition which comprises a thermoplastic polyester; a flame retardant containing an organic halide compound in an amount of 5 to 50 parts by weight based on 100 parts of weight of the thermoplastic polyester and an alkoxysilane compound of formula (B);

$$XR_4-\underset{\underset{OR_3}{|}}{\overset{\overset{OR_1}{|}}{Si}}-OR_2 \quad (B)$$

wherein each of $R_1$, $R_2$, $R_3$ and $R_4$ is an alkyl group having 1 to 5 carbon atoms or $-C_mH_{2m}-O-C_nH_{2n+1}$ wherein $m+n$ is an integer of 5 or less, and X represents $-CH=CH_2$, $-COOCH_3C=CH_2$, $-NH_2$, $-NHC_2H_4NH_2$, $-NHCONH_2$ or

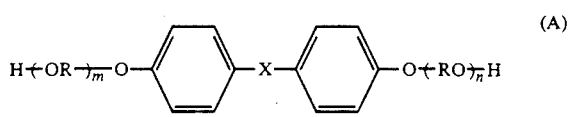

in an amount of 0.03 to 2.0% by weight of the flame retardant resin; and an antimony compound in an amount of 1 to 20 parts by weight based on 100 parts by weight of the thermoplastic polyester,
wherein said antimony compound is not previously coated with the alkoxysilane compound prior to formation of the flame retardant composition.

2. A flame-retardant resin composition as ian claim 1, wherein the antimony compound is at lest one selected from antimonate salts of a metal belonging to Group I, II and VIII of the Periodic Table.

3. A flame-retardant resin composition as in claim 2, wherein the antimonate salt is at least one of sodium antimonate and potassium antimonate.

4. A flame-retardant resin composition as in claim 1, wherein from 1 to 10 parts by weight of a copolymer, comprising ethylene and an α,β-unsaturated carboxylic acid in which from 5 to 50 mol % of the carboxylic groups contained in said copolymer are neutralized with an alkali metal, are present based on 100 parts by weight of the thermoplastic polyester.

5. A flame-retardant resin composition as in claim 1, wherein the thermoplastic polyester is polyethylene terephthalate.

6. A flame-retardant resin composition as in claim 1, wherein the thermoplastic polyester is a block copolymer of polyethylene terephthalate and a compound represented by the following general formula (A):

wherein X represents a divalent connecting group selected from $-C(CH_3)_2-$ group, $-SO_2-$ group, $-CO-$ group and $-O-$ group; R represents alkylene group having 1 to 4 carbon atoms; and n and m each represents an integer from 1 to 15;

and the content of the segments represented by the general formula (A) in said copolymer is from 1 to 20 parts by weight.

7. A flame-retardant resin composition as in claim 1, wherein less than 200 parts by weight of at least one of organic and inorganic reinforcing substances and filler are blended based on 100 parts by weight of the thermoplastic polyester.

8. A flame-retardant resin composition as in claim 1, wherein X is at least one of —NH$_2$, —NHC$_2$H$_4$NH$_2$, —NHCOHH$_2$ and

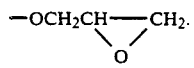

9. A flame-retardant composition as in claim 1, wherein the organic halide compound is an aromatic compound containing halogen atoms directly bonded to the aromatic ring.

* * * * *